United States Patent

Hsiao et al.

Patent No.: US 6,191,029 B1
Date of Patent: Feb. 20, 2001

(54) DAMASCENE PROCESS

(75) Inventors: Hsi-Mao Hsiao, Hsinchu; Chun-Lung Chen, Tainan Hsien; Shin-Fa Lin, Chang-Hua Hsien, all of (TW)

(73) Assignees: United Silicon Incorporated; United Microelectronics Corp., both of Hsinchu (TW)

( * ) Notice: Under 35 U.S.C. 154(b), the term of this patent shall be extended for 0 days.

(21) Appl. No.: 09/392,268

(22) Filed: Sep. 9, 1999

(51) Int. Cl.⁷ .................................................. H01L 21/4763
(52) U.S. Cl. ........................ 438/633; 438/637; 438/672; 438/702
(58) Field of Search ...................... 438/625, 633, 438/637, 669, 672, 675, 687, 688, 742, 754, 690, 691, 692, 694, 696, 697, 702

(56) References Cited

U.S. PATENT DOCUMENTS 5,075,763 * 12/1991 Spitzer et al. ............................ 357/71
5,229,325 * 7/1993 Park et al. ............................ 437/187
5,888,911 * 3/1999 Ngo et al. ............................ 438/788

OTHER PUBLICATIONS

Sun, Y.; Radjy, N.; Cagnina, S.; 0.8 Micron Double Level Metal Technology with SOG Filled Tungsten Plug. 8th International IEEE VLSI Multilevel Interconnection Conference, 1991. pp. 51–57.*

* cited by examiner

Primary Examiner—Olik Chaudhuri
Assistant Examiner—Ginette Peralta
(74) Attorney, Agent, or Firm—Thomas, Kayden, Horstemeyer & Risley

(57) ABSTRACT

A damascene process is described. An opening is formed in a dielectric layer. The opening is filled with a conductive plug. The conductive plug is etched back to substantially reduce the thickness of the conductive plug in the dielectric layer. A conformal top barrier layer is formed over the conductive plug.

19 Claims, 2 Drawing Sheets

DAMASCENE PROCESS

BACKGROUND OF THE INVENTION

1. Field of Invention

The present invention relates to a damascene process. More particularly, the present invention relates to a method of fabricating a metal interconnect for a semiconductor device.

2. Description of Related Art

Electromigration is the movement of the ions in a conductor (such as Cu) in response to the passage of current through it. These ions are moved "downstream" by the force of the "electron wind". A positive divergence of the ionic flux leads to accumulation of vacancies, forming a void in the metal. Such voids may ultimately grow to a size that results in an open-circuit failure of the conductor.

FIGS. 1A–1B are schematic, cross-sectional views of a conventional Cu damascene process.

Referring to FIG. 1A, a dielectric layer 101 is deposited over a substrate 100. The dielectric layer 101 is patterned to form an opening 102 exposing the substrate 100. The opening 102 is filled with a conductive plug. The conductive plug conventionally comprises a conformal titanium nitride (TiN) layer 104 and a copper (Cu) layer 106 in the opening 102.

Referring to FIG. 1B, a silicon nitride layer 108 and a plasma-enhanced oxide layer 110 are sequentially deposited over the dielectric layer 101. The plasma-enhanced oxide layer 110 is provided for the next damascene process.

Still referring to FIG. 1B, the Cu layer 106 directly contacts the overlying silicon nitride layer 108 in this damascene process. After performing a reliability test on this Cu layer 106, it is found that ions of such a Cu layer 106 migrate in the direction of the overlying silicon nitride layer 108, leading to accumulation of vacancies which form a void (not shown) in the Cu layer 106. Such voids may ultimately grow to a size that results in an open-circuit failure of the Cu layer 106.

SUMMARY OF THE INVENTION

The invention provides a damascene process. An opening is formed in a dielectric layer. The opening is filled with a conductive plug. An upper portion of the conductive plug is removed, thereby forming a concavity over the remaining conductive plug in the dielectric layer. The concavity is partially filled with a conformal top barrier layer in and over the dielectric layer. The concavity is over-filled with a spin-on-glass (SOG) layer over the top barrier layer. The portion of the spin-on-glass layer and the top barrier layer that lie over the dielectric layer is removed, thereby forming an electrical interconnect in the opening.

For one embodiment of this invention, the conductive plug comprises a conformal metal barrier layer and a Cu layer in the opening. Moreover, the top barrier layer can be made of titanium nitride (TiN), tantalum nitride (TaN), tungsten nitride (WN), titaniumtungsten alloy (TiW), titanium-tungsten nitride (TiWN), or any combination thereof.

In this present invention, the top barrier layer increases the resistance of the damascene process to electromigration failure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
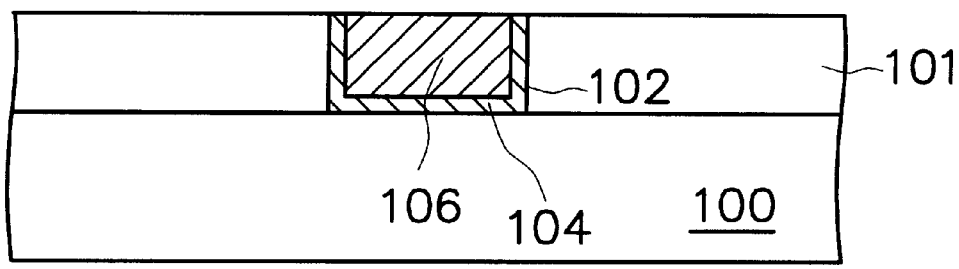
FIGS. 1A–1B are schematic, cross-sectional views of a conventional Cu damascene process.
Figure 1B:
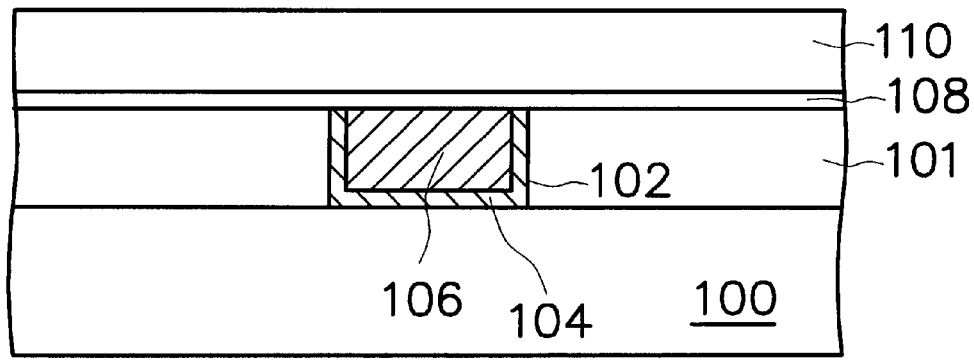

Reference will now be made in detail to the present preferred embodiments of the invention, examples of which are illustrated in the accompanying drawings. Wherever possible, the same reference numbers are used in the drawings and the description to refer to the same or like parts.

Figure 2A:
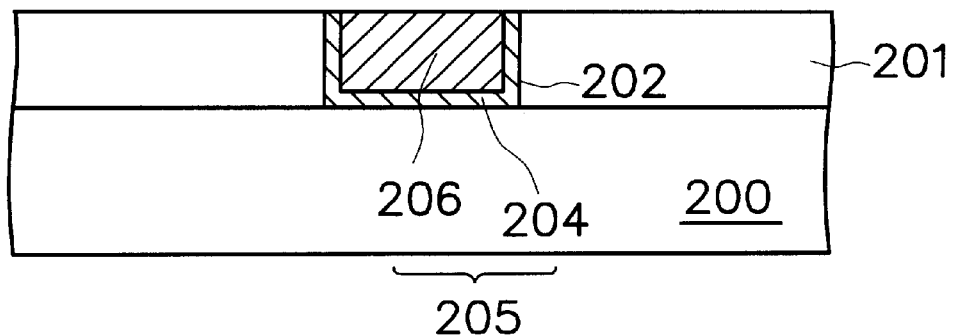
FIGS. 2A–2C are schematic, cross-sectional views of a damascene process according to one preferred embodiment of this invention.
Figure 2B:
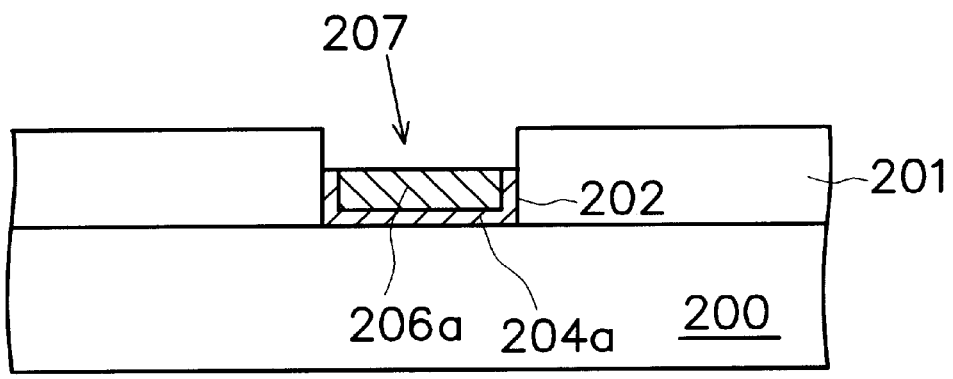
Figure 2C:
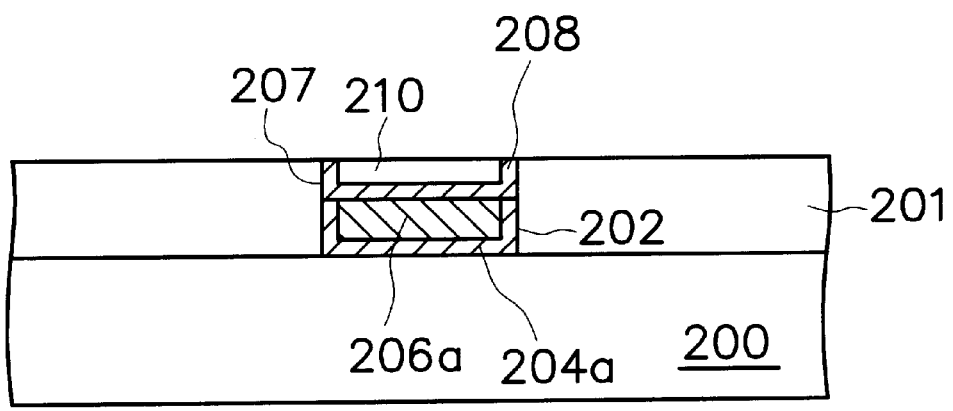

FIGS. 2A–2C are schematic, cross-sectional views of a damascene process according to one preferred embodiment of this invention.

As shown in FIG. 2A, a dielectric layer 201 is deposited over a substrate 200. The dielectric layer 201 is patterned to form an opening 202 exposing the substrate 200. The opening 202 is filled with a conductive plug 205 having an upper portion.

The conductive plug 205 comprises a conformal metal barrier layer 204 and a metal layer 206 in the opening 202. The metal layer 206 can be made of copper or aluminum. For one embodiment of the present invention, such a conductive plug 205 is formed by sequentially depositing a conformal metal material layer (not shown) and a metal material layer (not shown) over the substrate 200, and removing the portion of the conformal metal material layer and the metal material layer that lie on the dielectric layer 201.

The conformal metal layer 204 comprises a conductive material such as, for example, titanium nitride (TiN), tantalum nitride (TaN), tungsten nitride (WN), titanium-tungsten alloy (TiW), titanium-tungsten nitride (TiWN), or any combination of these materials. Those materials, which can be formed by sputtering deposition or chemical vapor deposition, have good thermal stability at high temperature and have good electrical conductivity. The tantalum nitride (TaN) and the combinations thereof have a copper-diffusion resistance higher than that of other materials, and are therefore the preferred materials. The titanium nitride (TiN), however, is also preferred because it is well developed as technology is scaled below 0.25 micrometers. This titanium nitride is preferably formed by chemical vapor deposition.

As shown in FIG. 2B, the conductive plug 205 (FIG. 2A) is etched back to remove the upper portion of the conductive plug 205, or to substantially reduces the thickness of the conductive plug 205, thereby forming a concavity 207 over the etched conductive plug. If the metal layer 206 is copper, a chemical gas having chlorine ($Cl_2$) can be used as a dry-etching gas in this etching back step. Other wet-etching recipes with high plug/substrate etching selection ratios also applicable for this etching back step. After being etched back, the metal barrier layer and the metal layer of the conductive plug are represented by the reference numerals 204a and 206a, respectively.

As shown in FIG. 2C, the concavity 207 is partially filled with a conformal top barrier layer (not wholly shown) in and over the dielectric layer 201. The concavity 207 is over-filled with a spin-on-glass (SOG) layer (not wholly shown) over the barrier layer 208. The portions of the SOG layer and the top barrier layer that lie over the dielectric layer 210 are removed to form an electrical interconnect in the opening 202. In the dielectric layer 201, the remaining SOG layer and top barrier layer are depicted by reference numerals 210 and 208, respectively. The SOG layer 210 can protect the top barrier layer 208 over the metal layer 206a from being damaged, especially when this removal step is performed by chemical mechanical polishing.

The SOG layer, which can comprise siloxane or silicate mixed in a solvent, is spun onto the top barrier layer. After being spun on, the SOG layer is baked to drive out the solvent, and the remaining solid film exhibits properties similar to those of $SiO_2$. This solvent, for dissolving materials having a Si-O bonding network such as siloxane or silicate, can be an alcohol-based solvent or alternatively a ketone-based solvent.

The conformal top barrier layer comprises a conductive material such as, for example, titanium nitride (TiN), tantalum nitride (TaN), tungsten nitride (WN), titanium-tungsten alloy (TiW), titanium-tungsten nitride (TiWN), or any combination of these materials. These materials, which can be formed by sputtering deposition or chemical vapor deposition, have good thermal stability at high temperature and have good electrical conductivity. The tantalum nitride (TaN) and the combinations thereof have a copper-diffusion resistance higher than that of other materials, and are therefore preferred materials. The titanium nitride (TiN), however, is also a preferred material because it is well developed as technology is scaled below 0.25 micrometers. This titanium nitride is preferably formed by chemical vapor deposition.

A role of this top barrier layer 208 is to increase the resistance of the damascene process to electromigration failure. Another role of this top barrier layer 208 is to prevent (or at least retard) the diffusion of the metal layer 206a and the overlying materials into each other, or to resist the tendency of a chemical reaction to form a new phase between the metal layer 206a and the overlying materials.

After the SOG layer and the top barrier layer are partially removed, the substrate 200 and films thereon are dipped in a buffer of etching solution (BOE). Another dielectric layer (not shown), such as a plasma-enhanced oxide layer, is then deposited over the substrate 200. The deposited dielectric layer is provided for the next damascene process. However, the scope of the invention is not limited to those process steps described in this paragraph. Persons skilled in the art can modify or rearrange those process steps without departing from the spirit of the invention.

It will be apparent to the skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A damascene process, comprising:
   forming an opening in a dielectric layer;
   filling the opening with a conductive plug having an upper portion;
   removing the upper portion of the conductive plug, thereby forming a concavity over the conductive plug in the dielectric layer;
   partially filling the concavity with a top barrier layer conformal to the dielectric layer;
   over-filling the concavity with a spin-on-glass layer over the top barrier layer; and
   removing portions of the spin-on-glass layer and the top barrier layer that lie over the dielectric layer, thereby forming an electrical interconnect in the opening.

2. The process of claim 1, wherein the conductive plug comprises a conformal metal barrier layer and a metal layer in the opening.

3. The process of claim 2, wherein the top barrier layer comprises a material selected from a group consisting of titanium nitride (TiN), tantalum nitride (TaN), tungsten nitride (WN), titanium-tungsten alloy (TiW), titanium-tungsten nitride (TiWN), and any combination thereof.

4. The process of claim 2, wherein the metal layer is made of copper.

5. The process of claim 4, wherein the upper portion of the conductive plug is removed by an etching gas containing chlorine ($Cl_2$).

6. The process of claim 2, wherein the metal layer is made of aluminum.

7. The process of claim 1, wherein the top barrier layer comprises a material selected from a group consisting of titanium nitride (TiN), tantalum nitride (TaN), tungsten nitride (WN), titanium-tungsten alloy (TiW), titanium-tungsten nitride (TiWN), and any combination thereof.

8. The process of claim 1, wherein the SOG layer is formed by the steps of:
   spin-on coating a liquid SOG layer; and
   baking the liquid SOG layer.

9. The process of claim 1, wherein portions of the spin-on-glass layer and the top barrier layer that lie over the dielectric layer are removed by chemical-mechanical polishing.

10. A damascene process, comprising:
    forming an opening in a dielectric layer;
    filling the opening with a conductive plug, wherein the conductive plug comprises a first barrier layer and a metal layer in the opening;
    etching back the conductive plug, thereby substantially reducing the thickness of the conductive plug in the dielectric layer; and
    forming a second barrier layer and a SOG layer in the dielectric layer, wherein the second barrier layer and the SOG layer are formed over the conductive plug.

11. The process of claim 10, wherein the metal layer is made of copper.

12. The process of claim 10, wherein the metal layer is made of aluminum.

13. The process of claim 10, wherein the conductive plug is etched back by using a chemical gas containing chlorine ($Cl_2$) as an etching gas.

14. The process of claim 10, wherein the second barrier layer is made of titanium nitride (TiN).

15. The process of claim 10, wherein the second barrier layer is made of tantalum nitride (TaN).

16. The process of claim 10, wherein the second barrier layer is made of tungsten nitride (WN).

17. The process of claim 10, wherein the second barrier layer is made of titanium-tungsten alloy (TiW).

18. The process of claim 10, wherein the second barrier layer is made of titanium-tungsten nitride (TiWN).

19. The process of claim 10, wherein the step of forming a second barrier layer and a SOG layer in the dielectric layer further comprises:

forming the second barrier layer on the dielectric layer and the conductive plug;

forming the SOG layer on the second barrier layer for filling the opening with the SOG layer; and removing portions of the second barrier layer and the SOG layer on the dielectric layer.

* * * * *